(12) United States Patent
Jacobs

(10) Patent No.: US 6,294,407 B1
(45) Date of Patent: Sep. 25, 2001

(54) MICROELECTRONIC PACKAGES INCLUDING THIN FILM DECAL AND DIELECTRIC ADHESIVE LAYER HAVING CONDUCTIVE VIAS THEREIN, AND METHODS OF FABRICATING THE SAME

(75) Inventor: Scott L. Jacobs, Pittsboro, NC (US)

(73) Assignee: Virtual Integration, Inc., Pittsboro, NC (US)

( * ) Notice: Subject to any disclaimer, the term of this patent is extended or adjusted under 35 U.S.C. 154(b) by 0 days.

(21) Appl. No.: 09/306,463

(22) Filed: May 5, 1999

Related U.S. Application Data

(60) Provisional application No. 60/084,450, filed on May 6, 1998.

(51) Int. Cl.[7] ............................ H01L 21/44; H01L 21/48; H01L 21/50

(52) U.S. Cl. .......................... 438/118; 438/110; 438/108

(58) Field of Search ........................... 257/777; 438/106, 438/107, 108, 110, 118

(56) References Cited

U.S. PATENT DOCUMENTS

| | | | |
|---|---|---|---|
| 3,614,832 | 10/1971 | Chance et al. | 29/626 |
| 3,871,015 | 3/1975 | Lin et al. | 357/67 |
| 4,283,839 | 8/1981 | Gursky | 29/589 |
| 4,695,870 | 9/1987 | Patraw | 357/74 |
| 4,714,516 | 12/1987 | Eichelberger et al. | 156/628 |
| 4,716,049 | 12/1987 | Patraw | 427/96 |
| 4,866,508 | 9/1989 | Eichelberger et al. | 357/74 |
| 4,902,606 | 2/1990 | Patraw | 430/314 |

(List continued on next page.)

OTHER PUBLICATIONS

DYCONEX Advance Circuit Technology, *DYCOstrate®—Technology*, www.dyconex.com.

Lau, *Ball Grid Array Technology*, McGraw–Hill, NY, pp. 22–27.

U.S. application No. 08/862,059, Jacobs, filed May 22, 1997.

*Primary Examiner*—Kevin M. Picardat
*Assistant Examiner*—D. M. Collins
(74) *Attorney, Agent, or Firm*—Daniels & Daniels, P.A.

(57) ABSTRACT

Microelectronic packages may be fabricated by forming a release layer on a process substrate. A thin film decal is formed on the release layer. The thin film decal includes first and second opposing decal faces, first decal input/output pads on the first decal face, second decal input/output pads on the second decal face and at least one internal wiring layer that electrically connects at least one of the first and second decal input/output pads. The first decal input/output pads are adjacent the release layer and the second decal input/output pads are remote from the release layer. A dielectric adhesive layer is then formed on the second decal face. The dielectric adhesive layer includes first and second opposing dielectric layer faces and conductive vias therein that extend between the first and second opposing dielectric adhesive layer faces. The first dielectric adhesive layer face is adjacent the second decal face and the second adhesive dielectric layer face is remote from the second decal face, such that at least one of the conductive vias electrically connects to at least one of the second decal input/output pads. The dielectric adhesive layer second face is then adhesively bonded to a second level substrate, such as a printed circuit board, that includes second level substrate input/output pads on a face thereof, such that at least one of the conductive vias electrically connects to at least one of the second level substrate input/output pads. The release layer is processed, for example dissolved, to thereby release the process substrate from on the first face of the thin film decal. A first level substrate, such as an integrated circuit chip, is then bonded to the first face of the thin film decal, for example by solder bump reflow.

10 Claims, 12 Drawing Sheets

U.S. PATENT DOCUMENTS

| | | | |
|---|---|---|---|
| 4,924,353 | 5/1990 | Patraw | 361/400 |
| 5,055,907 | 10/1991 | Jacobs | 357/71 |
| 5,148,265 | 9/1992 | Khandros et al. | 357/80 |
| 5,148,266 | 9/1992 | Khandros et al. | 357/80 |
| 5,258,330 | 11/1993 | Khandros et al. | 437/209 |
| 5,282,312 | 2/1994 | DiStefano et al. | 29/830 |
| 5,346,861 | 9/1994 | Khandros et al. | 437/209 |
| 5,347,159 | 9/1994 | Khandros et al. | 257/692 |
| 5,367,764 | 11/1994 | DiStefano et al. | 29/830 |
| 5,390,844 | 2/1995 | DiStefano et al. | 228/180.21 |
| 5,398,863 | 3/1995 | Grube et al. | 228/106 |
| 5,414,298 | 5/1995 | Grube et al. | 257/690 |
| 5,436,197 | 7/1995 | Hause | 437/183 |
| 5,601,678 * | 2/1997 | Gerber et al. . | |
| 5,656,547 | 8/1997 | Richards et al. | 438/460 |
| 5,719,749 | 2/1998 | Stopperan | 361/769 |
| 5,766,825 | 6/1998 | Shirai et al. | 430/327 |
| 5,807,766 | 9/1998 | McBride | 438/119 |
| 5,853,622 | 12/1998 | Gallagher et al. | 252/512 |
| 5,895,230 * | 4/1999 | Bartley . | |

\* cited by examiner

MICROELECTRONIC PACKAGES INCLUDING THIN FILM DECAL AND DIELECTRIC ADHESIVE LAYER HAVING CONDUCTIVE VIAS THEREIN, AND METHODS OF FABRICATING THE SAME

CROSS REFERENCE TO RELATED APPLICATION

This application claims the benefit of provisional Application Ser. No. 60/084,450, filed May 6, 1998, entitled *"Microelectronic Packages Including High-Density Interconnect Thin Film Graft Layer on a Low Density Interconnect Substrate"* to the present inventor.

FIELD OF THE INVENTION

This invention relates to microelectronic devices and fabrication methods, and more particularly to microelectronic packages and fabrication methods.

BACKGROUND OF THE INVENTION

Advances in semiconductor fabrication technology have allowed Very Large Scale Integration (VLSI) and Ultra Large Scale Integration (ULSI) integrated circuits, having up to several million devices thereon, to be reliably and economically produced. As device densities increase and device sizes shrink, system performance often becomes more limited by the interconnection and packaging of the integrated circuits, and not by the internal circuitry of the integrated circuits themselves. For example, package limitations such as the maximum allowed number of input/output pads may result in the inability to utilize all of the integrated circuit's capabilities. Multi-chip packaging may require wide spacing of integrated circuits to accommodate wiring channels, which may result in longer wiring distances for integrated circuit interconnection, and may lead to increased parasitic capacitance and a decrease in system speed. Moreover, complex packaging structures may be expensive and unreliable.

Printed circuit board (PCBs) are widely used substrates for interconnecting Integrated Circuit (IC) chips and various other components which can make up electrical systems. Packaged chips and other devices are typically picked and placed onto the surface of a PCB and electrical connections are then made by reflowing low temperature (Eutectic) solders between the outer leads of the IC chip package and pads on the surface of the PCB. This "Surface Mount" PCB technology has been successfully utilized for many years to build up all but the most exotic electronic systems and at the present time may still represent the most common PCB technology currently practiced.

The PCB itself originally was developed to eliminate the need to wire electrical components together with individual wires. Individual wiring generally is a time consuming and thereby expensive process for all but the simplest of electronic systems. The first systems built on PCBs used discrete electronic components such as individual resistors, capacitors etc. utilizing through-hole technology. With the advent of the IC, the interconnect demand on PCBs significantly increased due to the need to connect the multiple small Input/Output terminals of a packaged IC. Through-hole IC carriers (single and dual-in line packages) generally replaced the lead wires of discrete components and were passed through the PCB and soldered from the backside of the board, similar to the manner of soldering the discrete component wire leads. Surface mount technology, wherein the leads of an IC carrier are connected at the front surface, eliminated the need for the through-holes and conserved internal PCB active interconnect area.

Unfortunately, it may be difficult to economically build additional layers of printed wiring to support the interconnects that are desired for advanced ICs. Moreover, shrinking the wiring patterns and/or increasing the number of layers of the board to increase interconnect density may be increasingly difficult and costly to accomplish with traditional PCB technology. High end and highly miniaturized systems also have been built utilizing complex and expensive ceramic and composite substrates. Ceramic Multi-Chip-Module (MCM) technology is an example of an alternative packaging technology. These types of packages may not be economically viable for low cost consumer electronic systems.

Several other technologies for extending PCB technology without completely changing (i.e. to ceramic instead of fiberglass/epoxy) the basic material set (organic dielectric/copper conductor) are being investigated. These types of approaches include DYCO strate/MicroVia (see www.dyconex.com), Surface Laminated Circuit Boards (SLC-See U.S. Pat. No. 5,766,825 to Shirai et al.) and Flex Patches on Board (see U.S. Pat. No. 5,719,749 to Stopperan et al.). Adding thin film interconnect by directly processing it on the surface a PCB also is being explored.

With the exception of Flex Patches on Board, wherein a patch of flexible interconnect is transferred to the surface of the board, radical changes in the way a substrate is processed may be required by the PCB manufacturer to achieve these technologies. Radical departure from the basic PCB technology may require a long and costly development effort on the part of PCB manufacturers to implement. Moreover, the increase in interconnect density may be incremental. For example, geometries may remain above micron range pitches—they may remain in the mil range. Furthermore, the cost of producing these substrates may remain high.

Unfortunately, accomplishing fine line lithography with the basic PCB material set may be a difficult task for several reasons. First, unlike silicon wafers, the PCB may be far from an ideal substrate for the production of fine line wiring. Moreover, unlike the IC industry that uses 6", 8" and 12" or larger standard wafer formats, standard equipment to directly produce fine line wiring on PCBs does not appear to be available.

The above survey indicates that there continues to be a need for packaging technology that can provide high density at low cost and that need not have an appreciable effect on the standard processing PCBs, so that the basic PCB technology may be extended.

SUMMARY OF THE INVENTION

It is therefore an object of the present invention to provide improved microelectronic packages and methods of fabricating the same.

It is another object of the present invention to provide microelectronic packages that can allow high density wiring to be used with conventional printed circuit boards.

It is still another object of the present invention to provide microelectronic packaging and fabrication methods that can allow conventional printed circuit board technology to be extended to high performance and/or high density microelectronic systems.

These and other objects can be provided, according to the present invention, by providing a thin film decal and a dielectric adhesive layer that includes a plurality of conductive vias therein, between a first level microelectronic substrate and a second level microelectronic substrate. The combination of the thin film decal and the dielectric adhesive layer including a plurality of conductive vias therein can provide an interconnect packaging technology that can be low cost and/or high density, and can be used in conjunction with printed circuit boards that are produced by standard board process technology. The capabilities of printed circuit board technology therefore can be extended.

More specifically, microelectronic packages according to the present invention comprise a first level substrate including a plurality of microelectronic devices and a plurality of first level substrate input/output pads on a face thereof. The first level substrate may be an integrated circuit. A thin film decal is on the face of the first level substrate. The thin film decal includes first and second opposing faces. A plurality of first decal input/output pads are on the first face, at least one of which is electrically connected to at least one of the first level substrate input/output pads. A plurality of second decal input/output pads are on the second face. At least one internal wiring layer in the thin film decal is electrically connected to at least one of the first and second decal input/output pads. A second level substrate including a plurality of second level substrate input/output pads on a face thereof also is provided. The second level substrate may be a printed circuit board.

According to the invention, a dielectric adhesive layer is provided that is adhesively bonded to the thin film decal and that also is adhesively bonded to the second level substrate. The dielectric adhesive layer includes a plurality of conductive vias therein that electrically connect at least one of the second level substrate input/output pads to at least one of the second decal input/output pads. The conductive vias preferably comprise conductive adhesive vias, and more preferably are screened conductive adhesive vias comprising conductive paste.

Microelectronic packages may be fabricated, according to the present invention, by forming a release layer on a process substrate. The process substrate is preferably a glass substrate, silicon substrate or other sacrificial substrate rather than a relatively high cost microelectronic substrate. A thin film decal is formed on the release layer. The thin film decal includes first and second opposing decal faces, a plurality of first decal input/output pads on the first decal face, a plurality of second decal input/output pads on the second decal face and at least one internal wiring layer as was described above. The first decal input/output pads are adjacent the release layer and the second decal input/output pads are remote from the release layer.

A dielectric adhesive layer is then formed on the second decal face. The dielectric adhesive layer includes first and second opposing dielectric layer faces and a plurality of conductive vias therein that extend between the first and second opposing dielectric adhesive layer faces, as was described above. The first dielectric adhesive layer face is adjacent the second decal face and the second adhesive dielectric layer face is remote from the second decal face, such that at least one of the conductive vias electrically connects to at least one of the second decal input/output pads.

The dielectric adhesive layer preferably is formed on the second decal face by adhesively bonding to the second decal face, a dielectric adhesive layer including therein a plurality of holes, at least one of which laterally overlaps at least one of the second decal input/output pads. A conductive adhesive layer is then screened into the at least one of the holes in the dielectric adhesive layer. The dielectric layer preferably comprises Teflon or glass fiber impregnated epoxy resin. The conductive adhesive layer preferably comprises a Transient Liquid Phase Sintering Conductive Adhesive, as described in U.S. Pat. No. 5,853,622 to Gallagher et al., assigned to Ormet Corporation, the disclosure of which is hereby incorporated herein by reference in its entirety.

The dielectric adhesive layer second face is then adhesively bonded to a second level substrate, such as a printed circuit board, that includes a plurality of second level substrate input/output pads on a face thereof, such that at least one of the conductive vias electrically connects to at least one of the second level substrate input/output pads. Adhesive bonding may take place using pressure and/or heat, at atmospheric pressure or under vacuum.

The release layer is processed, for example dissolved, to thereby release the process substrate from on the first face of the thin film decal. The release layer may be processed by etching and/or by laser.

A first level substrate, such as an integrated circuit chip, is then bonded to the first face of the thin film decal. The first level substrate is bonded to the first face of the thin film decal, such that at least one of the conductive vias electrically connects to at least one of the first level substrate input/output pads. Bonding preferably takes place by solder reflow.

It also will be understood that after forming the dielectric adhesive layer on the thin film decal, the substrate, the thin film decal and the dielectric adhesive layer may be singulated so that conventional pick-and-place techniques may be used to pick and place the singulated substrate including the thin film decal and the dielectric adhesive layer thereon on the second level package, such as a printed circuit board.

Accordingly, an interconnect packaging technology may be provided that can produce low cost and/or high density microelectronic packages. This technology may be used in conjunction with printed circuit boards that are produced by standard board process technology, to thereby allow extension of the capabilities of printed circuit board technology. This extendable technology can be a viable adjunct to the printed circuit board technology, even as the wiring density in the printed circuit board itself is increased. Microelectronic packages and packaging methods according to the present invention need not be limited to use with printed circuit boards. Other thick film substrates, such as ceramic chip carriers, may benefit from application of the present invention as a high density surface layer. The present invention also may be used on substrates for purposes other than interconnect.

According to the invention, the thin film decal and dielectric adhesive layer are "cast" on a substantially smooth and planar process substrate surface. Subsequent inversion of the thin film decal and dielectric adhesive layer upon transferring to the second level packages exposes the first face of the thin film decal which is also substantially smooth and planar. Thus, the present invention can reduce and preferably eliminate the topography that may inevitably result when building up multilayers of interconnection.

The present invention may be regarded as a "Planar Graft Patch" (PGP) including a thin film decal and a dielectric adhesive layer having conductive vias therein, that can be used between a first level substrate and a second level substrate, to provide an interconnect packaging technology that can provide low cost and/or high density.

DETAILED DESCRIPTION OF PREFERRED EMBODIMENTS

Figure 1:
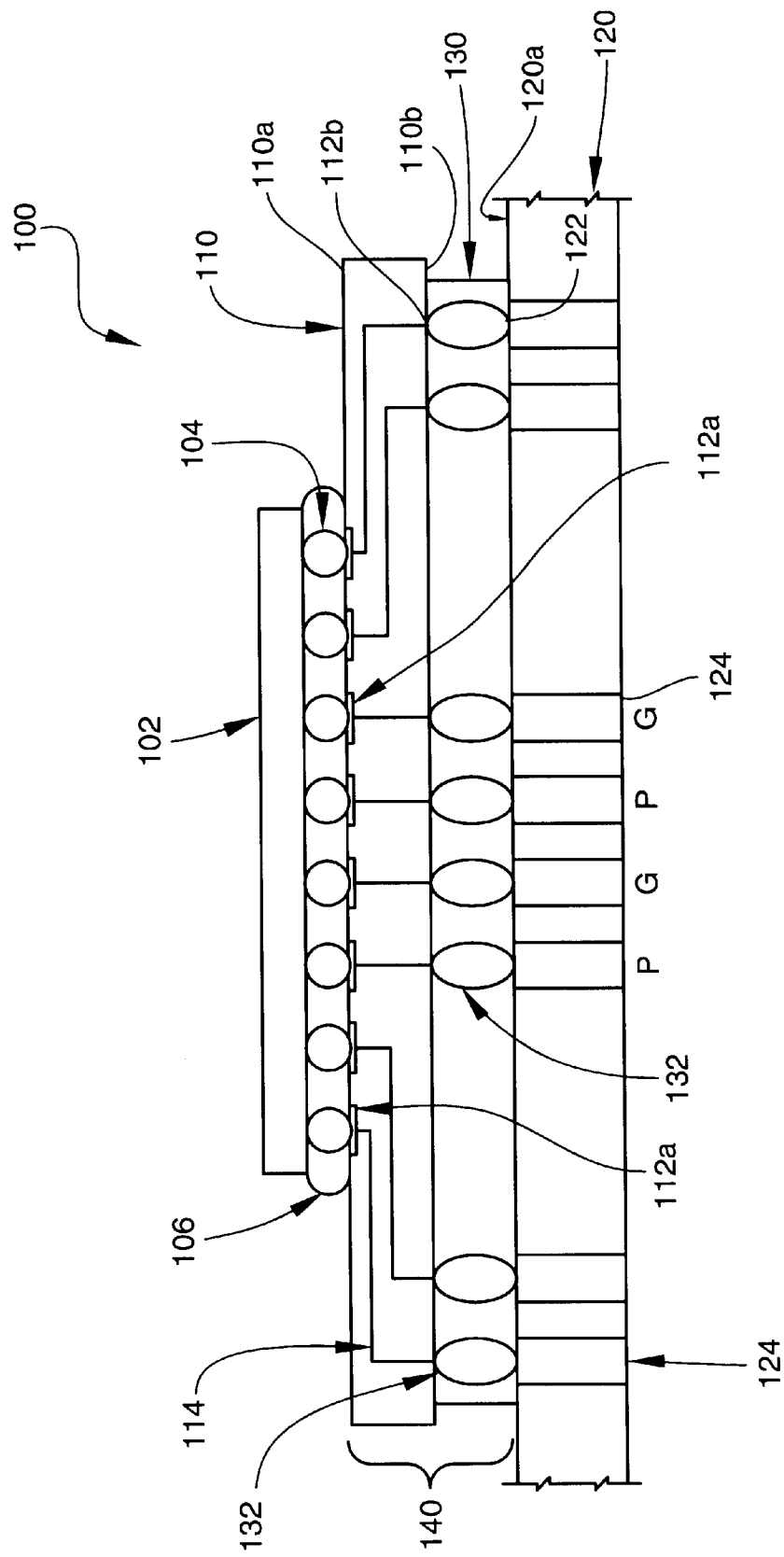
FIG. 1 is a cross-sectional view of a first embodiment of microelectronic packages according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will also be understood that when a layer is referred to as being "on" another layer or substrate, it can be directly on the other layer or substrate, or intervening layers may also be present.

Referring now to FIG. 1, a first embodiment of microelectronic packages according to the present invention is illustrated. As shown in FIG. 1, a microelectronic package 100 includes a first level substrate 102 including a plurality of microelectronic devices and plurality of firs level substrate input/output pads on a face thereof. The first level substrate may be a flip-chip integrated circuit, other integrated circuit and/or other first level microelectronic substrate. It will be understood that the term "pads" is used herein to indicate any input/output site on a substrate, and can include pins and/or other exposed conductive surfaces.

Still continuing with the description of FIG. 1, a thin film decal 110 is included on the face of the first level substrate 102. The thin film decal includes at least first and second opposing faces 110a and 110b. Face 110a preferably is substantially planar and topography-free. A plurality of first decal input/output pads 112a is included on the first face. At least one of the first decal input/output pads 112a is electrically connected to at least one of the first level substrate input/output pads. In FIG. 1, this connection is accomplished by solder bumps 104. However, other interconnection technologies may be used. An underfill layer 106 also may be provided surrounding the solder bumps 104 in a manner well known to those having skill in the art.

The thin film decal 110 also includes a plurality of second decal input/output pads 112b on the second face 110b thereof. At least one internal wiring layer 114 is included that is electrically connected to at least one of the first and second decal input/output pads 112a and 112b, respectively. The fabrication of a thin film decal is well known to those having skill in the art. Thin film decals are described, for example, in copending application Ser. No. 08/862,059, to the present inventor entitled *Methods of Fabricating Virtual Integration Microelectronic Packages*, assigned to the assignee of the present application, the disclosure of which is hereby incorporated by reference in its entirety.

Still continuing with the description of FIG. 1, a second level substrate 120 includes a plurality of second level substrate input/output pads 122 on a face 120a thereof. A plurality of second level substrate vias 124 also may be included to provide signal power (P), ground (G) and signal and/or other connections. The second level substrate 120 preferably is a printed circuit board that is well known to those having skill in the art.

According to the invention, a dielectric adhesive layer 130 is adhesively bonded to the thin film decal 110 and also is adhesively bonded to the second level substrate 120. The dielectric adhesive layer 130 includes a plurality of conductive vias 132 therein that electrically connect at least one of the second level substrate input/output pads 122 to at least one of the second decal input/output pads 112b.

The combination of the thin film decal 110 and the dielectric adhesive layer 130 including conductive vias 132 therein may be referred to herein as a Planar Graft Patch (PGP) structure 140. Thus, FIG. 1 may be considered as illustrating an integrated circuit first level substrate 102 that is flip-chip joined to the surface of the PGP 140. The solder bumps 104 are shown as circles, and can serve as the electrical connections from the flip-chip integrated circuit 102 to the rest of the microelectronic package 100. The solder bumps 104 may be surrounded by an underfill material 106, which can enhance the reliability of the solder joints and the thermal conduction between the first level substrate 102 and the remainder of the package. It also will be understood that the first decal input/output pads, and any other pads described herein, may be a simple thin film metal that is suitable for low temperature solder bumps. Alternatively, Eutectic solder also may be included over a thin film structure that is suitable for joining non-melting high-lead solder bumps or other leads of a component that have no solder themselves.

The thin film decal 110 is a conductor/dielectric structure that can fan out the tight geometry of the first level substrate solder bumps 104 to the larger geometry of the second level substrate 120, such as a printed circuit board. The dielectric adhesive layer 130 glues the thin film dielectric to the surface of the second level package 120. Conductive vias 132 in the dielectric adhesive layer 130 carry electrical signals, power and/or ground to the thin film.

Figure 2:
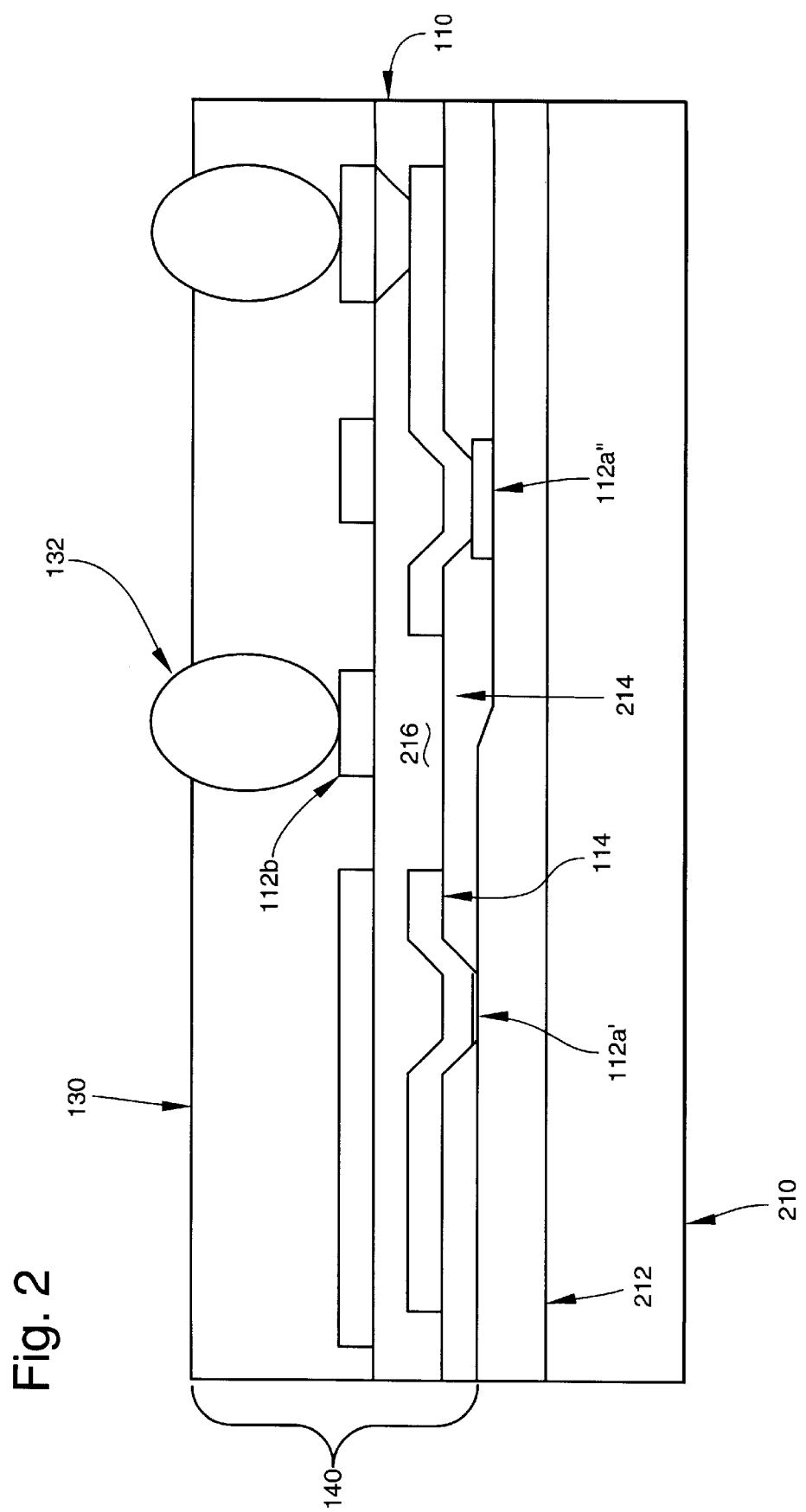
FIG. 2 is a detailed cross-sectional view of a planar graft patch on a process substrate according to the present invention.

Referring now to FIG. 2, a more detailed cross-sectional view of a PGP 140 that is formed on a process substrate 210 will be described. As already described, the POP 140 includes a dielectric adhesive layer 130 and a thin film decal 110.

Starting from the bottom of FIG. 2, the process substrate 210 may be a low cost sacrificial substrate, such as a glass substrate or a silicon substrate, that is subsequently released from the PGP 140, as will be described below. A release layer 212 is provided on the process substrate 210. The thin film decal 110 is provided on the release layer. As shown, the thin film decal 110 may include a plurality of first decal input/output pads 112a. The pads may be as simple as clean copper, as shown at 112a'. Alternatively, the pads may comprise complex metallurgy, as shown at 112a", including solder and a pad structure. Simple and complex pads may be mixed on one substrate as illustrated. It will be understood that pads need not be a discrete layer of metal, but rather can be sections of the internal wiring layer that are exposed by selective openings in the decal.

As was shown in FIG. 1, the pads 112a serve as islands to which a first level package 102 is eventually connected after the PGP 140 is transferred to the second level package 120. The first decal input/output pads 112 may be used for soldering any type of connection to an electronic component, and are not limited to flip-chip pads. For example, Surface Mount Technology (SMT) components that utilize solder connections may be used. If a low temperature dielectric is utilized to build up the thin film decal, a Eutectic solder layer may be fabricated in the PGP itself, thus reducing and preferably eliminating the need to screen solder onto the PGP pads after transferring the PGP to the printed circuit board.

Continuing with the description of FIG. 2, the thin film decal 110 includes a plurality of dielectric layers. In FIG. 2, a first dielectric layer 214 and a second dielectric layer 216 are shown. The first dielectric layer 214 can act as a solder dam to prevent solder from wetting along conductive copper interconnect lines in the dielectric. A preferred dielectric may comprise a high performance organic dielectric, such as BenzoCycloButene (BCB) or a polyimide. An advanced low temperature epoxy dielectric can allow for Eutectic solder to be included in the PGP.

An internal wiring layer 114 is shown between the first and second dielectric layers 214 and 216. The internal wiring layer may be fabricated from copper with thin layers of an adhesion material such as titanium on the opposing surfaces of the copper. Internal vias may be made in layers of the dielectric that separate the interconnect and power supply metal layers. Although only one internal wiring layer is shown in FIG. 2, a plurality of internal wiring layers may be used, separated by one or more dielectric layers.

At the top surface of the decal 110 in FIG. 2, a plurality of second decal input/output pads 112b are shown. As was already described, these second input/output pads 112b may be separate pads, pins or exposed surfaces of the internal wiring layer without requiring pad definition or solder dams.

Finally, the dielectric adhesive layer 130 including a plurality of conductive vias 132 is shown on decal 110. The dielectric adhesive layer 130 may be a glass- or Teflon-impregnated epoxy bond ply, a pure screened dielectric epoxy and/or other dielectric adhesive layer. The dielectric adhesive layer preferably should not shrink substantially during the lamination and curing thereof, as shrinkage may result in voids in the dielectric adhesive layer following cure. Accordingly, non-shrinking materials such as Bolger Research, Inc. D-18 screenable dielectric paste may be preferred. The conductive vias 132 preferably are adhesive conductive vias, such as a conductive epoxy including Ormet conductive epoxy as described in the above-referenced U.S. Pat. No. 5,853,622. The dielectric adhesive layer 130 may adhere the thin film decal 110 to the second level package 130, prevent contaminants from getting under the decal by sealing the surface, and/or prevent short circuits between conductive vias 132 and exposed metal in the decal.

Figure 3:
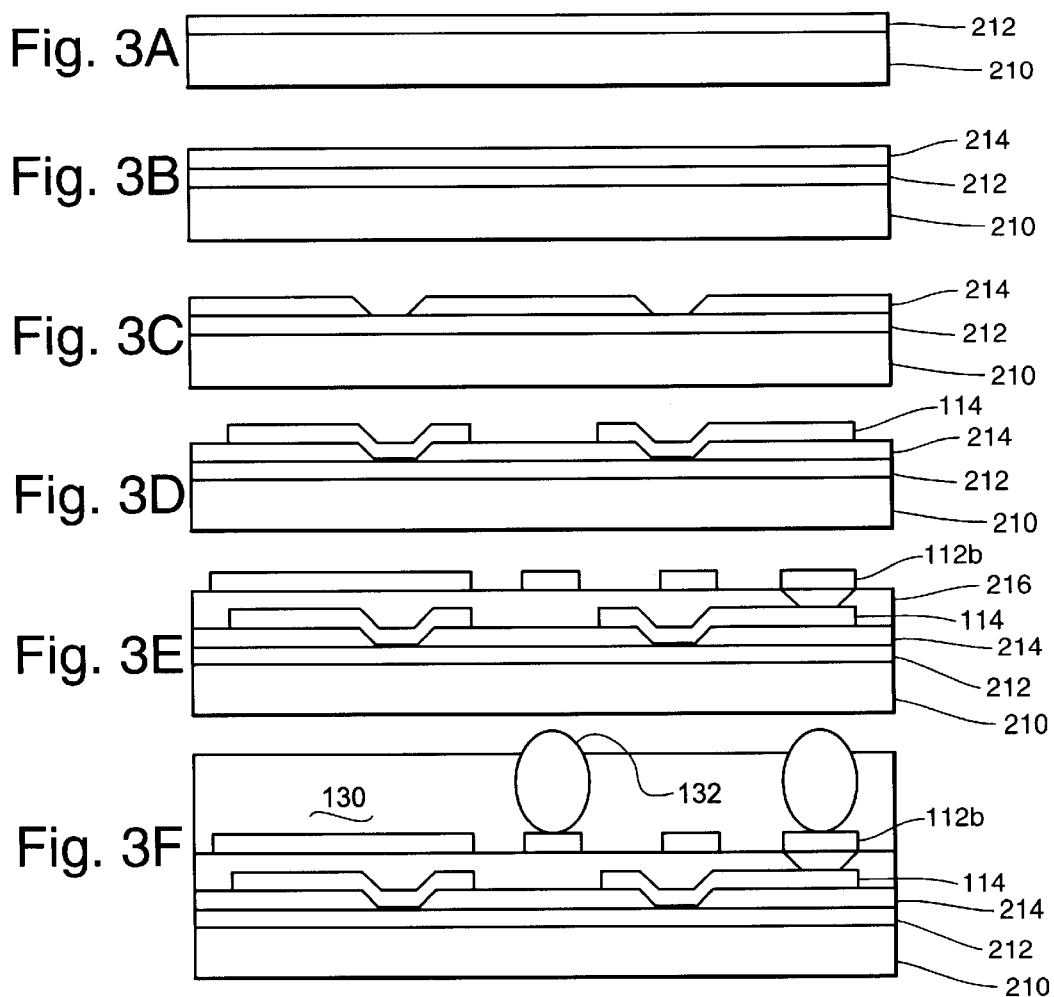
FIGS. 3A–3F are cross-sectional views illustrating planar graft patches according to the present invention during intermediate fabrication steps.

Referring now to FIGS. 3A–3F, a process for fabricating a PGP of FIG. 2 will be described. As shown in FIG. 3A, a release layer 212 is spun on a process substrate 210. The process substrate 210 may be glass ($SiO_2$), silicon or other conventional substrates that may be utilized with microelectronic processing equipment. The release layer may comprise Polyimide Release Layer (PIRL), a pre-imidized polyimide that is marketed by Brewer Scientific.

Then, referring to FIG. 3B, the first dielectric layer 214 is formed, for example by spin-on-coating. The first dielectric layer preferably comprises BenzoCycloButene (BCB). However, other dielectrics such as polyimide may be used. As shown in FIG. 3C, vias are etched in the first dielectric layer. As shown in FIG. 3D, the internal wiring layer 114 is formed, for example by depositing and patterning thin film metal using conventional techniques.

Then, in FIG. 3E, the second dielectric layer 216 is spun-on and vias are etched, as was already described in connection with FIGS. 3B and 3C. The second decal input/output pads 112b may then be formed, for example by depositing and patterning thin film metal. It will be understood that two or more internal wiring layers also may be provided.

Finally, in FIG. 3F, an adhesive layer including a plurality of holes therein, is formed on the second decal input/output pads 112b, for example by placing a preformed bond ply of fiber-impregnated dielectric adhesive. The holes preferably at least partially overlap the second decal input/output pads 112b. A conductive adhesive may then be screened in the holes in the dielectric adhesive layer to form the conductive vias 132. It also will be understood that the dielectric adhesive also may be a screened dielectric adhesive such as Bolger Research D-18.

Figure 4:
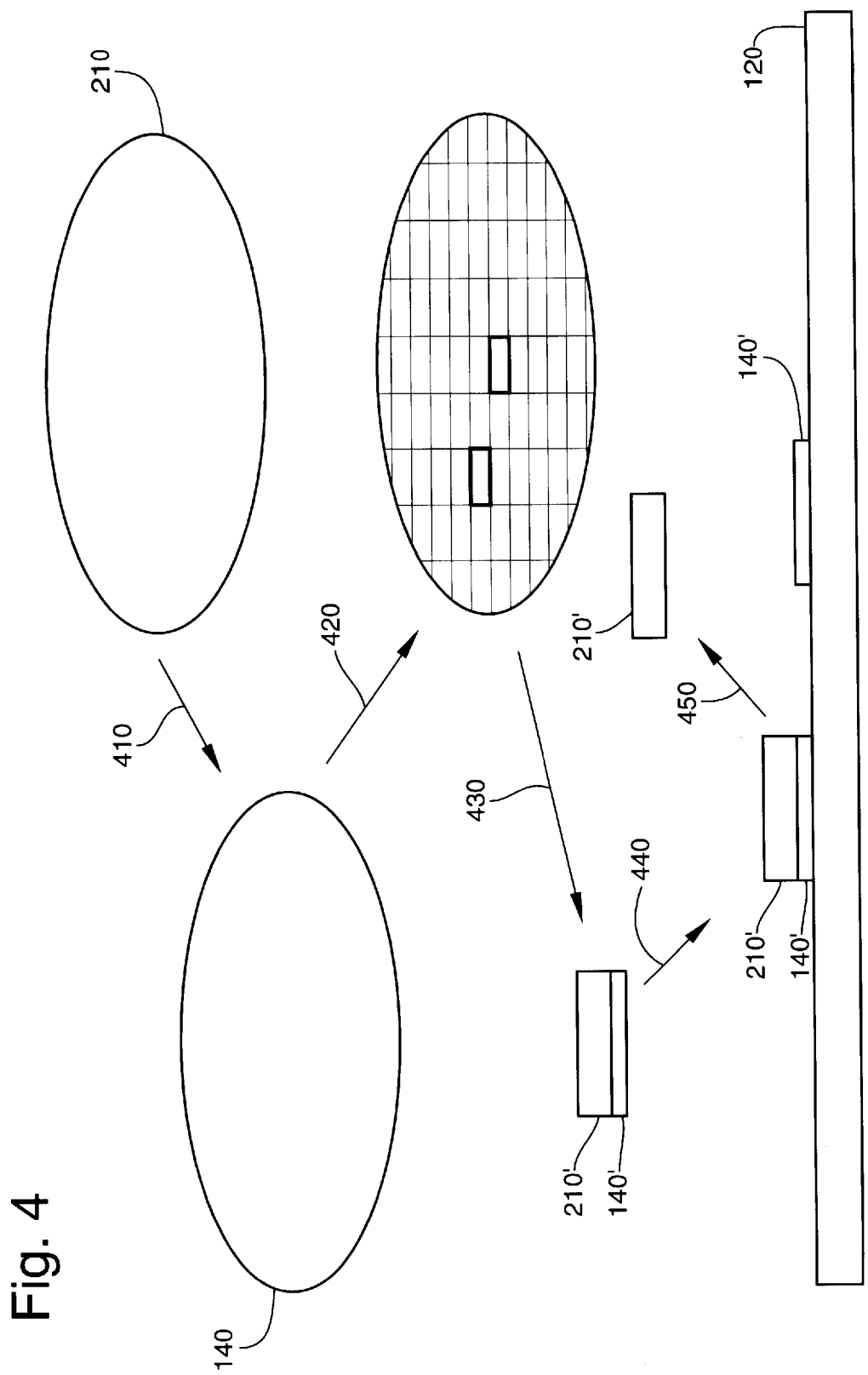
FIG. 4 is a simplified diagram illustrating methods of fabricating microelectronic packages according to the present invention.

FIG. 4 is a simplified diagram illustrating methods of fabricating microelectronic packages according to the present invention. As shown by arrow 410, a PGP 140 is fabricated on a process substrate 210, in the manner illustrated in FIGS. 2 and 3A–3F. The screened materials may be dried, for example using a low temperature bake. As shown by arrow 420, the process substrate 210 and PGP 140 are diced by conventional sawing, scribing and breaking, and/or other suitable singulation techniques. Then, as shown by arrow 430, the singulated PGPs 140' may then be picked, aligned and placed on a second level substrate 120, preferably by using automatic pick and place equipment.

The singulated PGP 140' is then laminated to the second level substrate 120, for example by applying heat (e.g. 200° C.) and/or pressure (e.g. 10 psi), preferably under vacuum. Finally, as shown by arrow 450, the singulated process substrate 210' is then removed, for example by dissolving the release layer 212 and/or destroying the adhesion to the thin film with a UV laser when a quartz process substrate 210 is used. A PIRL release layer may be dissolved in Tetra Methyl Ammonium Hydroxide (TMAH) based developer, assisted by ultrasonics. A laser may be utilized to destroy bonds or an underlayer material may be etched out in an appropriate etchant in a batch process. The batch process may be preferred since multiple substrates may be processed in a tank, to thereby allow cost reduction compared to a laser process. The PGP 140' on the second level substrate 120 may add a height of between about 25 $\mu$m and about 75 $\mu$m to the second level substrate 120.

At the conclusion of processing of FIG. 4, the PGP is integrated onto the second level package 120 and is ready to receive a first level package. A first level package, such as a flip-chip IC is flip-chip soldered to the thin film decal 110 using conventional solder reflow.

Figure 5:
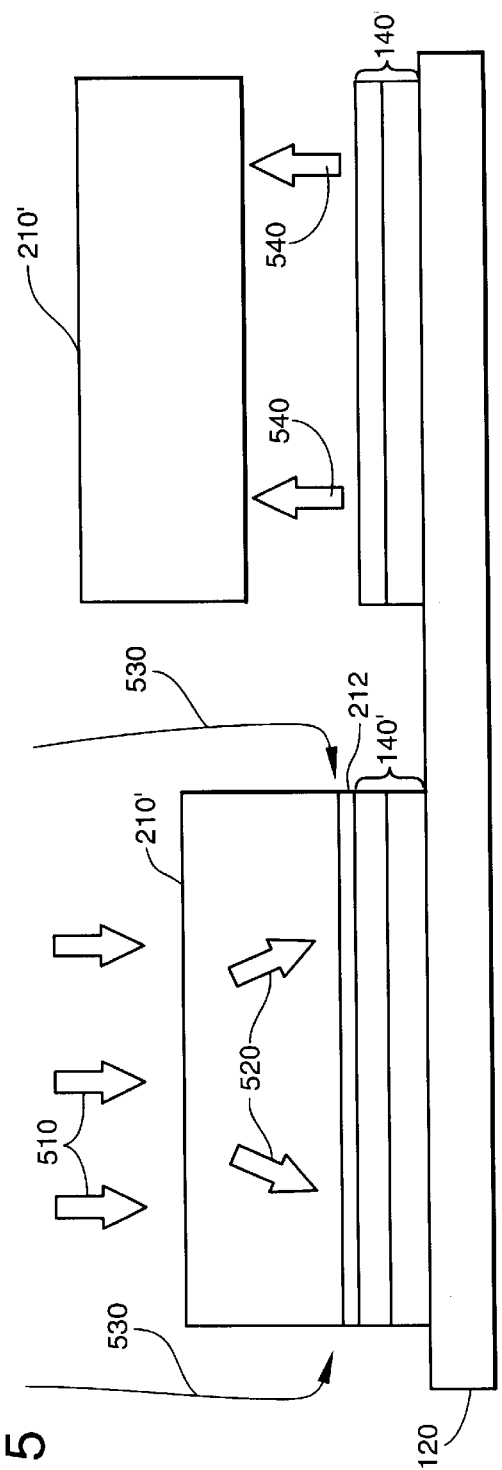
FIG. 5 illustrates details of release processes of a planar graft patch from a process substrate according to the present invention.

Referring now to FIG. 5, details of the release process that was described in connection with arrow 450 of FIG. 4 are shown. The process substrate 210' may be a 20 mil thick glass substrate. The thin film release layer 212 may be 5 $\mu$m thick, the thin film decal 110 may be between 10 $\mu$m and 15 $\mu$m thick, and the dielectric adhesive layer 130 may be 2 mils in thickness.

As shown in FIG. 5, a laser may be used in the direction of arrows 510 and 520 to dissolve the thin film release layer 212. Alternatively, a batch soak may be used in the direction of arrows 530 to dissolve the release layer. At the right side of FIG. 5, the singulated process substrate is shown removed by arrows 540. Preferred materials for a laser release layer 212 are high temperature polyimides. Water soaks into polyimides and the combination of UV induced polyimide-to-substrate bond breaking and vaporization of water may release the thin film decal from the substrate. It should be understood that a transparent process substrate such as quartz may be needed for laser release.

Figure 6:
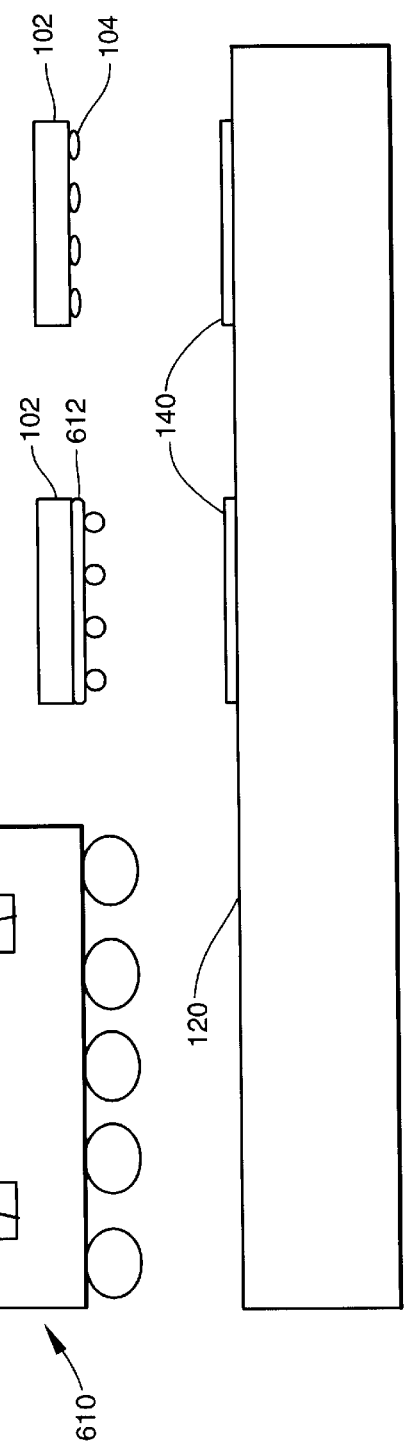
FIG. 6 compares microelectronic packages according to the present invention with a conventional Ball Grid Array.

FIG. 6 illustrates a comparison between microelectronic packages according to the present invention and a conventional Ball Grid Array (BGA). The BGA 610 shown at the left of FIG. 6, may be seen to be much more complicated than a flip-chip integrated circuit 102 or a flip-chip circuit 102 including a thin film decal 612 and using a PGP 140 according to the present invention.

Figure 7:
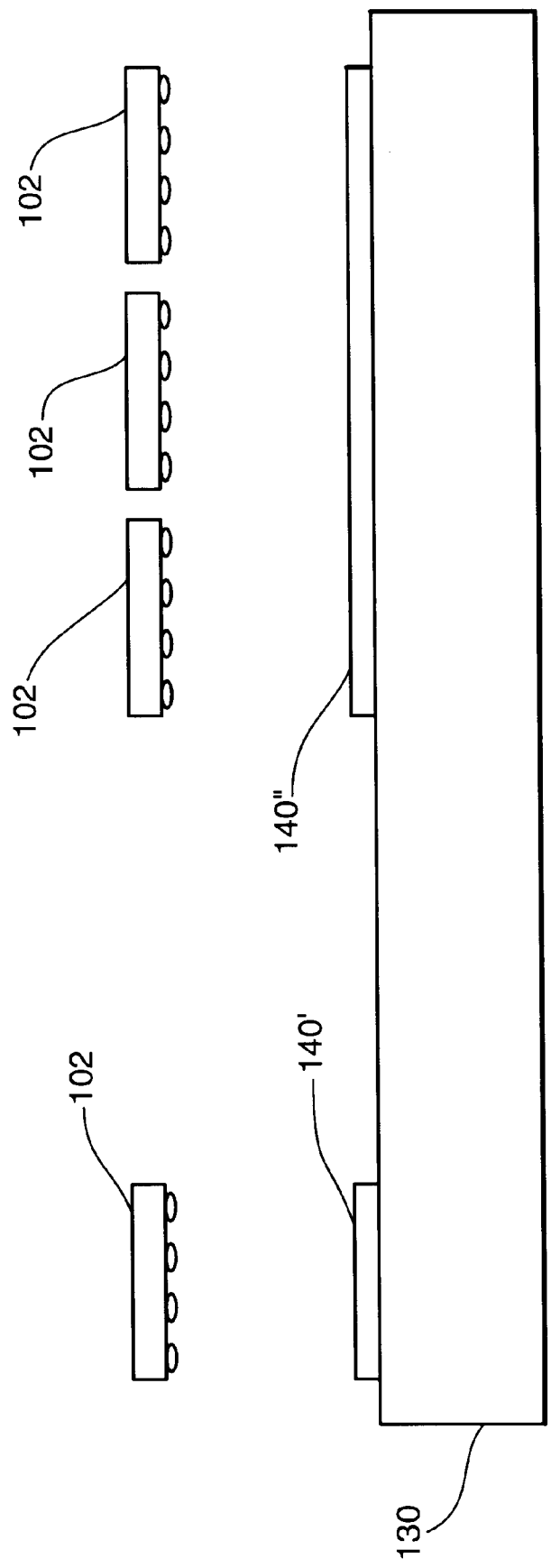
FIG. 7 illustrates applications of planar graft patches according to the present invention.

FIG. 7 illustrates applications of a PGP 140 according to the present invention. On the left a single chip fan-out site is shown. The PGP 140' provides thin film lines that can spread the high-density area array pads on the chip 102 out to a larger grid more suitable for fabrication with PCB technology. On the right side, multiple chips 102 are illustrated being placed over a larger PGP 140". This POP 140" can provide both fan-out as on the left side and also can allow fine line connections to be made between chips. A built in Multi-Chip Module (MCM) can be achieved. The combination of thin film in the decal for high-density short run interconnection and thicker film in the PCB for long run interconnection can represent a very efficient use of the strengths of both the thin film (high-density, low capacitance lines) and the PCB (low resistance wires for longer interconnects) and can avoid their respective weaknesses. With PGP this advantage may be realized without the need to utilize costly, complex direct lithography processes on the PCB.

Additional discussion of potential advantages of the present invention now will be provided. Transformation of the fine geometries of IC chips to the coarser geometries of thicker film substrates may be difficult for microelectronic packages. It may be a problem for both large and small integrated circuit die. Small ICs, in many cases, may be made much larger than needed merely to accommodate the output pads of the devices. This waste of semiconductor territory on a wafer can be quite costly to the manufacturer. Smaller pads could be made in order to shrink the devices but they may not be matched to the coarse pads of the PCB. Large devices may suffer from the need to fan-out a large number of I/O pads to the coarse PCB pads. The wiring in a PCB and the surface density of pads may not accommodate this need.

MCMs were proposed as an heir-apparent to the PCB in order to solve these and/or other problems. One potential flaw in MCMs is that for long signal lines, thicker film may still be needed to reduce the resistance of the long run interconnection. The MCM presently has not been adopted widely for electronic systems for this and/or other reasons.

Composite substrates have been proposed as a solution to the resistivity problem of pure MCMs. These have been used, for example in mainframe technology—thin film on thick film ceramic. Unfortunately, these exotic thick film substrates may place the cost of these solutions beyond the reach of many electronic systems.

Direct lithography of fine line geometry on a PCB has been proposed as one solution to these problems. Unfortunately, there may be many extreme challenges to direct lithography on a PCB. First, the PCB is far from an ideal substrate on which to perform lithography. In particular, the substrates are warped. This puts the features out of focus—which may be a major deficiency for fine line photolithography.

Moreover, the location of features across the PCB may be far off from a perfect grid due to differential shrinkage, among other factors. Full field lithography masks may be difficult, if not impossible, to use. Step and repeat lithography may be possible, but unlike on a semiconductor wafer where the same pattern is being repeated over and over, the thin film patterns across the PCB may vary widely and therefore a number of different reticles may be needed to step and repeat the different patterns. Changing these during the photo process for each board may be inadvisable due to the expense of the time involved in doing so.

Direct write lithography may be the only option left for direct lithography on a PCB. Unfortunately, mass produced products which have relied on direct write lithography for fine feature thin film generally have been economically infeasible due to a number of factors including time to write a substrate. In photolithography, the lithographic field of the substrate should be written in the most efficient fashion possible to minimize the "time in tool—written area of substrate" figure of merit. Thus, presently there may be no satisfactory solutions for direct thin film lithography on a PCB.

Finally, the surface of a PCB may be extremely rough and irregular due to thick surface pads, solder masks, fibers, drilling artifacts and a number of other factors. Lapping to planarize the surface may be expensive and the results may be questionable at best.

There is therefore a need in the industry for systems and methods that can economically apply fine line structures to thick film substrates. The present invention can fulfill this need.

From a lithographic standpoint, the PGP can take advantage of tried and true methods developed over the years for IC microlithography. Full field masks with repetitious patterns may be utilized. The process substrate may be selected to fit standard tools, and may be selected to provide a smooth, lithography grade platform for the PGP fabrication process. For example, smooth silicon wafers may be used for the process substrate. Silicon wafers can provide industry standard smooth platforms for fabricating the PGP. The lithographic figure of merit mentioned above may therefore be improved and preferably maximized.

Another potential advantage of a PGP is that the fine line thin films that can solve the various problems described above may be placed on a PCB precisely, and only where they are needed. This can efficiently solve the region-by-region problem of locating thin films on a PCB.

Simple screening techniques and post processes (e.g. B staging epoxies) well known to those skilled in the art may be utilized to apply the adhesives (conductive, dielectric) that can be used to mate the thin films to the PCB. This preferably may be accomplished prior to singulation of the process substrate, thereby allowing reduced handling of parts.

After singulating PGPs of varying patterns from a number of process substrates, standard high speed pick and place tools may be utilized to place the PGPs in their respective locations on a PCB. Vacuum lamination in standard PCB process tools can accomplish mechanical and electrical contact of the adhesives to the board. One of several liftoff processes described above may then be utilized to remove the process substrate.

Then, the PCB and PGP are integrated into a composite interconnect structure that is ready for placement of electronic components that require or can significantly benefit from the high-density surface structures. This composite structure can therefore serve as an economically feasible solution to a wide variety of the problems facing the industry today with respect to the current limitations of electronic system packaging.

Figure 8:
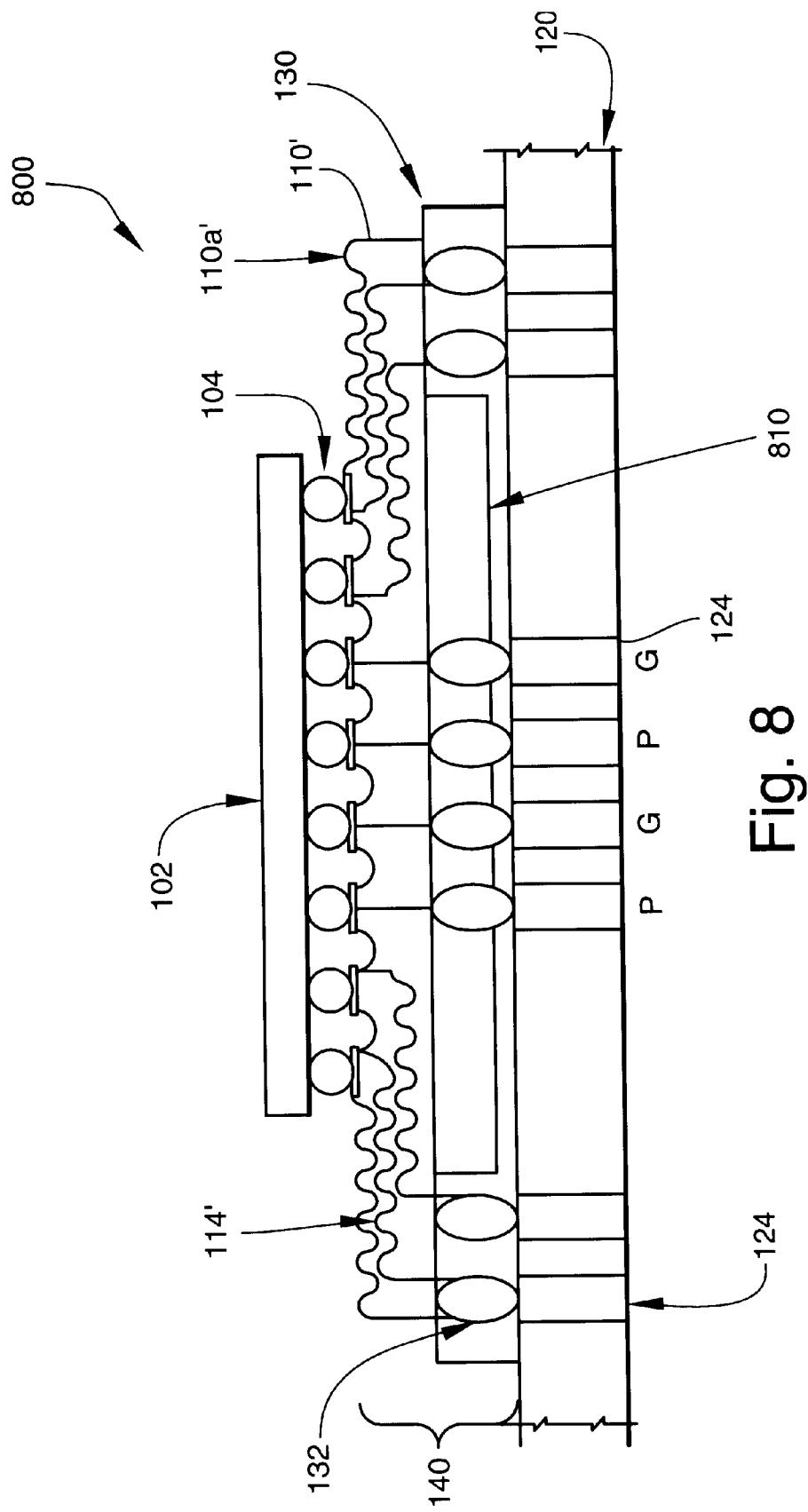
FIG. 8 illustrates an alternative embodiment of microelectronic packages according to the present invention.

Referring now to FIG. 8, an alternative embodiment of microelectronic packages according to the present invention will now be described. In contrast with the microelectronic package 100 of FIG. 1, the microelectronic package 800 of FIG. 8 can provide additional stress relief. In particular, in FIG. 8, an elastomeric stress buffer 810 is provided within the dielectric adhesive layer 130. A presently preferred material for the elastomeric stress buffer 810 is silicone. Also, the thin film decal 110' is rippled to provide a rippled first surface 110a' and a rippled internal wiring layer 114' therein. Rippling can provide added flexibility but may require added process steps.

Figure 9:
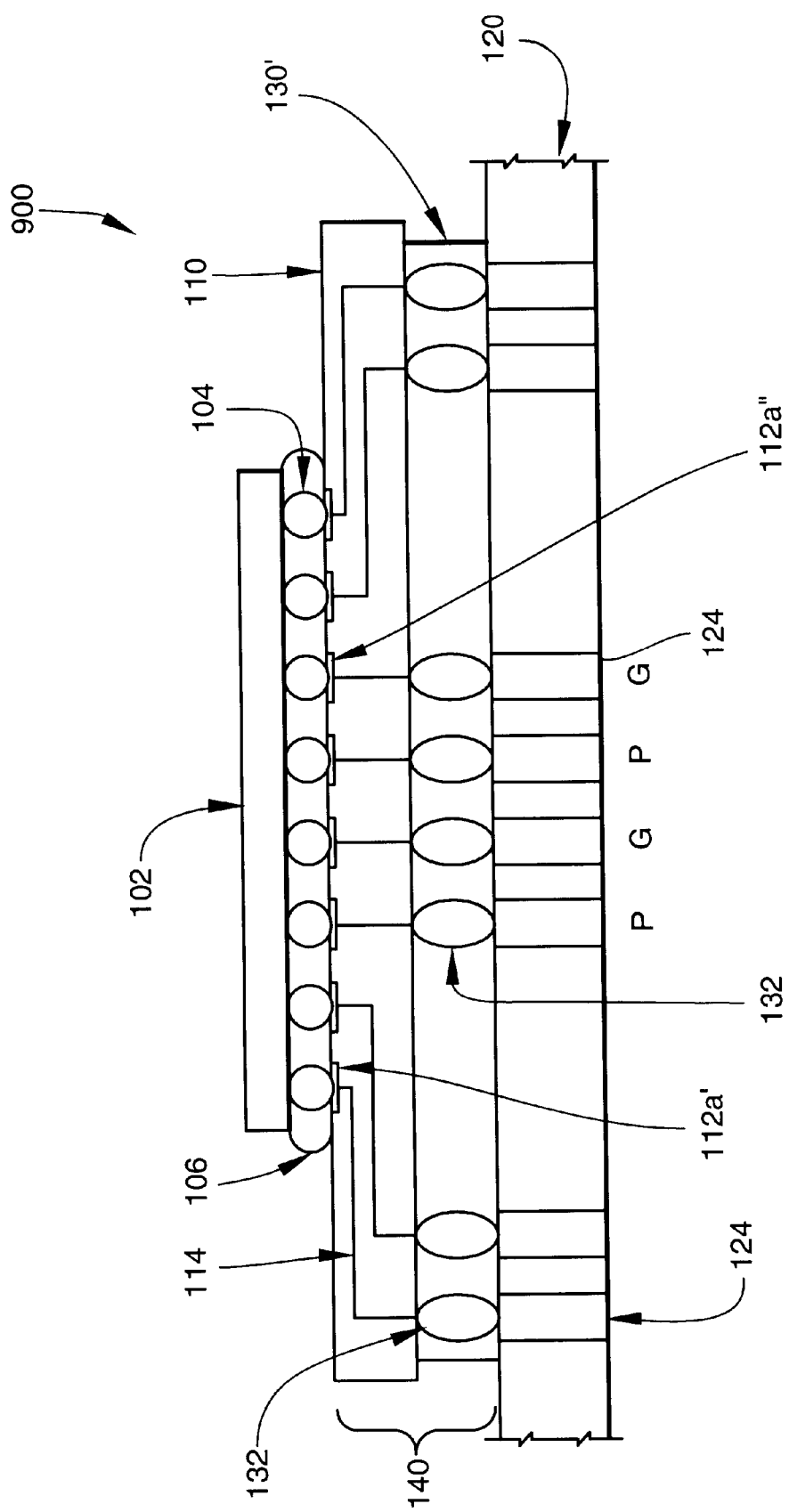
FIG. 9 illustrates yet another embodiment of microelectronic packages according to the present invention.

Alternatively, as shown in FIG. 9, the microelectronic package 900 may include an elastomeric dielectric adhesive layer 130'. A presently preferred elastomeric dielectric material is silicone. This may be preferred for lower costs of processing. Alternatively, as described above, conductive vias 132 only may be screened. In another alternative, after placement of the die block on the board and curing the conductors 132, the elastomer may be injected into the gap to fill the space.

Figure 10:
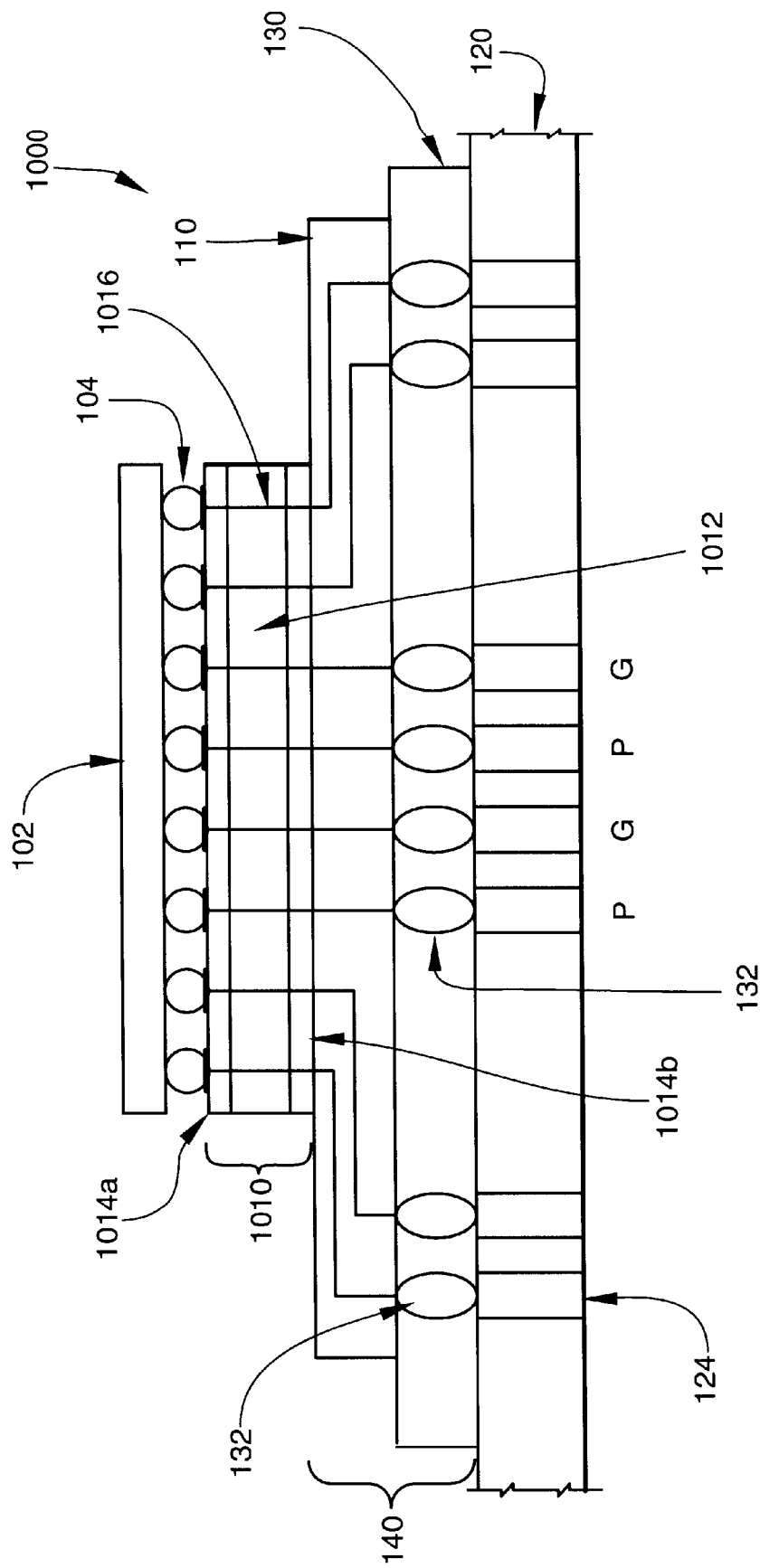
FIG. 10 illustrates still another embodiment of microelectronic packages according to the present invention.

FIG. 10 illustrates yet another embodiment of microelectronic packages according to the present invention. As shown in FIG. 10, microelectronic package 1000 includes an elastomeric interposer 1010 between the thin film decal 110 and the first level substrate 102. The elastomeric interposer includes an elastomeric stress buffer 1012, a layer of anisotropic conductive adhesive 1014a and 1014b on opposite surfaces of the elastomeric stress buffer 1012 and a vertical thin film 1016 that electrically connects both sides of the interposer. The coating of anisotropic adhesive 1014a and 1014b may be used to make electrical contact on both sides of the interposer 1010. However, it will be understood that many other techniques may be used to establish this electrical contact. The interposer 1010 may be attached first to the first level package 102, to the second level package 120, or both contacts may be made simultaneously. Exceptional stress relief may be obtained.

Figure 11:
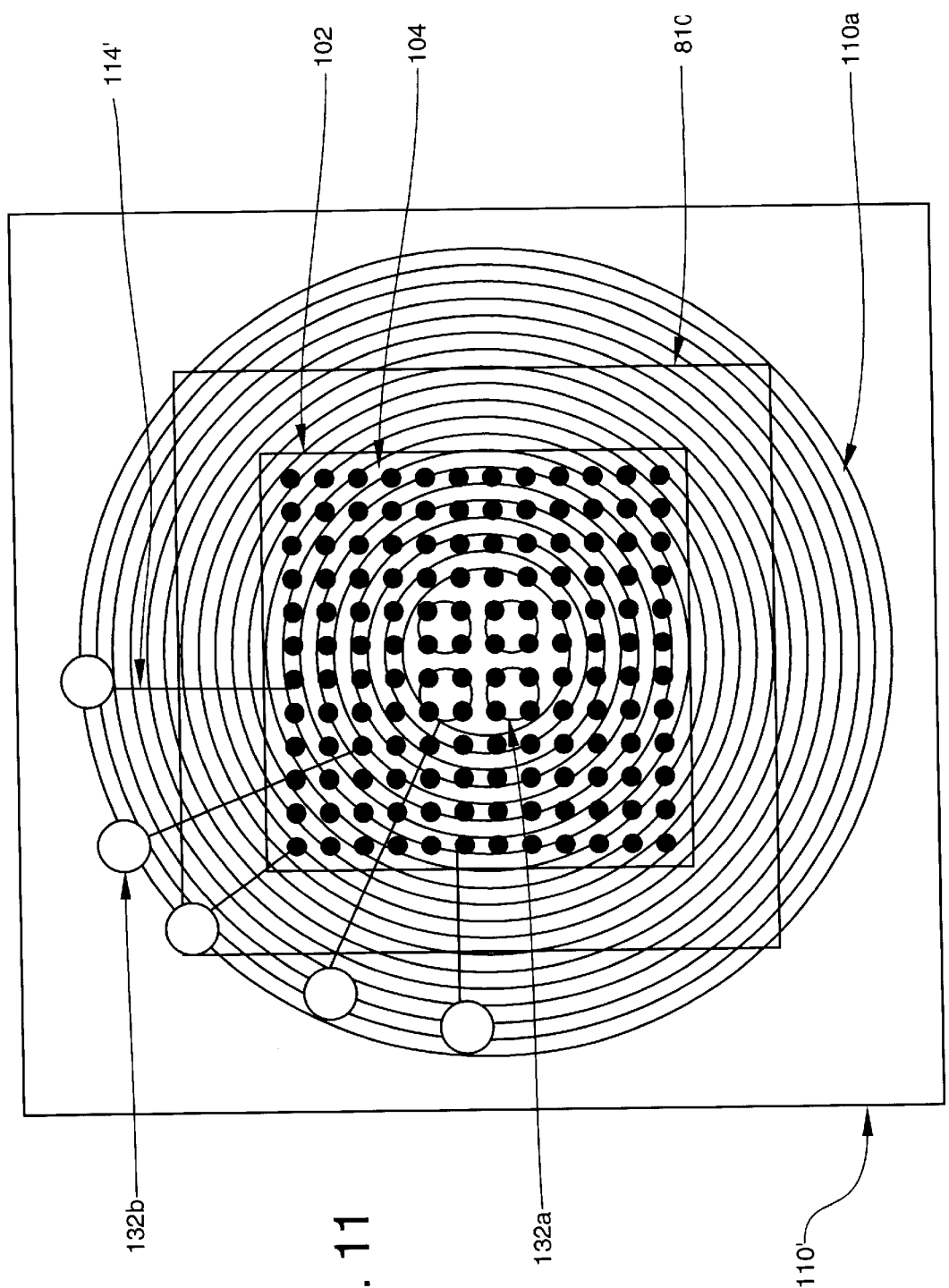
FIG. 11 is a top plan view of microelectronic packages of FIG. 8.

FIG. 11 is a top plan view of the microelectronic package of FIG. 8. As shown in FIG. 11, the ripples may be arranged in a radial pattern, and the internal wiring layer 114' may be arranged generally perpendicular thereto. This can allow the decal 110' and internal wiring layers 114' to flex in the critical radial direction during thermal excursions. It will be understood that the frequency of the ripples may be exaggerated. It also will be understood that the conductive vias 132a that carry power and ground may be placed at the center of the structure of FIG. 11 while the conductive vias 132b that carry signals may be placed at the periphery of the structure of FIG. 11.

Referring again to FIGS. 8 and 11, the microelectronic packages 800 include the following aspects: First, the thin film decal 110' has been rippled to provide for spring action as the substrate and IC differentially expand and contract during thermal cycles. The amplitude and frequency of the ripples are not shown to scale—both may be much smaller. Second, an elastomeric layer 810 beneath the first level substrate 102, and preferably extending beyond the boundaries of the first level substrate 102, allows for movement of the spring action decal, thereby allowing reduced thermally induced stress on the solder joints and allowing improved reliability.

In FIG. 8, a flip-chip mounted IC 102 is shown in cross-section solder joined to a PGP structure 140. Axial concentric ripples have been lithographically defined in the decal 110' so that the decal, which may be stiff and brittle, can provide a spring action capability in the radial direction. The pitch and amplitude of the ripples are exaggerated in the drawing. In a real structure with 5 mil solder bumps on 10 mil centers, the peaks and valleys may be on a 1 mil pitch. The amplitude of the ripples may be in the range of 5 microns. The ripple pattern may be depleted in the area of the actual solder joint pad to provide a planar surface in that local region to enhance the solder process. The internal wiring layer 114' may follow the topography of the decal and hence also exhibit spring action. It should be understood that the thicknesses of the decal and copper layers are greatly exaggerated with respect to other features for purposes of clarity of viewing.

Beneath the thin film decal 110', an elastomeric material 810 is illustrated. This acts as a stress buffer between the IC and PCB insofar as it is highly deformable allowing the spring of the thin film decal to stretch back and forth with temperature cycles. The elastomeric material 810 preferably extends beyond the boundary of the IC 102 so that the outer copper traces can experience spring effect stretching inwardly. Outward stretching is provided by ripples under the IC. The thicker and more deformable the elastomer, the greater may be the stress relief on the solder bump. Power and ground feedthroughs are shown in the central region of the chip. These can provide low inductance power and ground to the IC. There may be a point at which a satisfactory distance-to-neutral point exists for these interior feedthroughs such that their more rigid nature may not result in stress induced failure. They may not be placed at all points under an IC unless it is a very small die.

To the sides and underneath the elastomer an adhesive which serves the purpose of gluing down the structures described above may be used. Exterior signal feedthroughs are illustrated near the edges on either side.

Figure 12A:
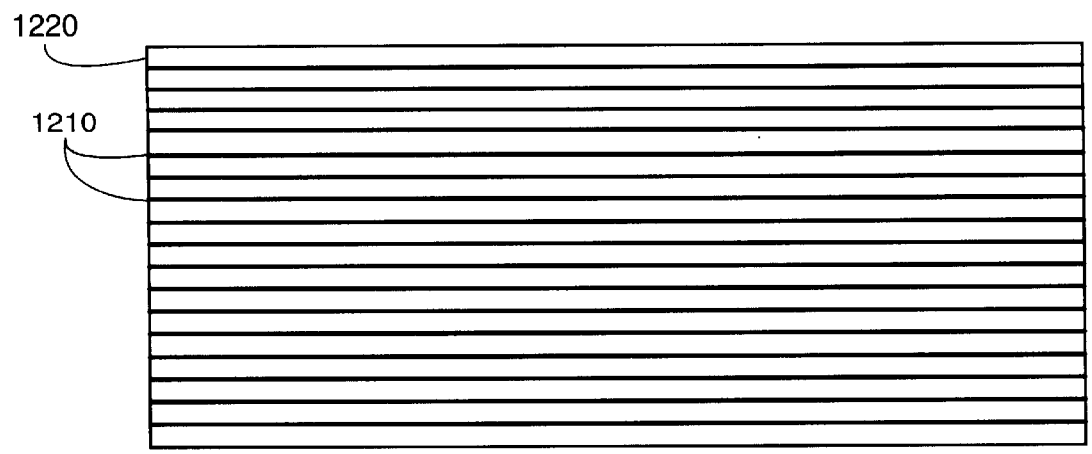
FIGS. 12A and 12B illustrate an embodiment of elastomeric stress buffers of FIG. 10 during intermediate fabrication steps.
Figure 12B:
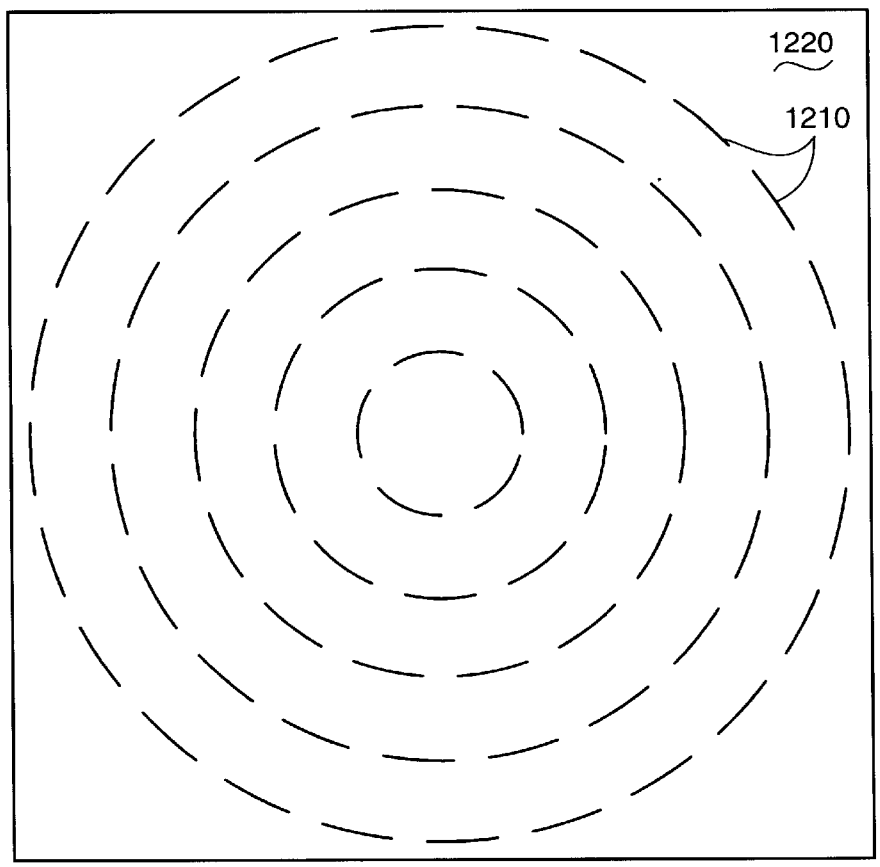

Referring now to FIGS. 12A and 12B, methods of fabricating an elastomeric stress buffer 1012 of FIG. 10 including vertical thin films 1016 therein will now be described.

As shown in FIG. 12A, thin film conductor lines 1210 are lithographically fabricated on a cured elastomer sheet 1220. The thin films are placed on a fine grid so that they will eventually meet solder bump pads in a random fashion such that no shorts occur between solder pads and no opens exist for any given solder pad.

Next, the elastomer sheet 1220 is coated with uncured elastomer and tightly rolled up as shown in FIG. 12B. The coating is then cured. A cylinder with long axial thin films results. Due to rolling up the sheet as described, only the width of the thin films face perpendicular to the radii of the cylinder. This can result in near perfect flexibility compared to wires or other such structures which may be fed through an elastomer sheet to achieve a similar purpose.

Slices are then cut out of the cylinder, which may be squared off with a punch if desired as shown in FIG. 12B. It will be understood that the geometries are very much finer than illustrated in the plan view shown in FIG. 12B. An electrically conductive coating then may be applied on the top and bottom surfaces, either patterned or anisotropic in the z direction, such as the well known Sheldahl material. The resulting structure may then be used as the stress buffer 1012 illustrated in FIG. 10. It also may be used in a wide variety of other direct electronic device attachment schemes. The vertical structures also may be approximated by plating up axially oriented metal.

In joining a flip chip IC (e.g. silicon) device to a substrate with an unmatched thermal coefficient of expansion an inherent reliability problem may be created due to mechanical stress on the joint. A high expansion PCB, for instance, may shrink as much as 1 mil or more from the freezing point of typical solder joining temperatures down to room temperatures over a distance equivalent to that subtended by an IC. This can result in a bowing of both the IC and the PCB. The stress is such that the solder bumps generally are inwardly tensed. Thus, the potential exists of shearing bumps by tendency of the IC to exert force on the joint in the outward direction.

Complicating this situation is the fact that electronic systems generally should survive both much colder temperatures and also that fact that thermal cycling between these colder temperatures and temperatures higher than the normal operating temperature of the system are routinely performed. The dynamic motion fatigues even a solder joint that was originally stable. For large ICs directly flip-chipped to boards, cycling between room and operating temperatures themselves may be severe enough conditions to cause the failure of solder joints. The outermost solder bumps generally are the most highly stressed with the stresses generally diminishing on each bump as one proceeds to the center of the IC where the zero stress point exists. Distance to Neutral Point (DNP) is a term that has been coined to designate the furthest distance from the zero stress region at the center of a die (neutral point) that a solder joint will survive all processing, environmental and dynamic cycling requirements for a given system.

Without changing the substrate to a lower expansion material closer to that of the IC, several techniques for improving the reliability of solder joints have been proposed and/or implemented by Tessera, ChipScale and others. See, for example U.S. Pat. No. 5,346,861 to Khandros et al. and U.S. Pat. No. 5,656,547 to Richards et al. Unfortunately, these techniques may require special processing of the IC die beyond a basic solder bump process on the IC. IC manufacturers generally may prefer to utilize the simplest bumping process which involves simply fabricating solder bumps on the surface of the chip without the need for additional or special processing which can add cost and can reduce yields of the ICs. There is therefore a need in the industry to provide for improved reliability of simple solder process joints on standard PCB substrates.

There are a number of features that may be incorporated into PGP structures that may improve the reliability of solder joints. These features need not require special processing of the IC die beyond fabrication of simple solder bumps, and need not require changing the substrate from typical high expansion PCB materials to exotic and costly low expansion substrates. Several structures will be described generally and a preferred embodiment will be described in detail.

Typical PCBs may have localized nonplanarities in the range of mils at the surface so it is expected that the adhesive stack may need to be greater than this so that the glue may flow around these features without leaving voids. A thickness of 5 mils or more therefore may be expected in a real product. The thicker this adhesive is made, the thicker the elastomer also may be made. The degree of stress relief may increase as the thickness of the elastomer increases. The upper limit in this thickness may be determined by the ability to process the feedthroughs and the adhesive. A vast majority of today's ICs may significantly benefit from the thicknesses discussed here.

It will be understood that there are many variations of the basic elastomeric structures illustrated herein. Some of these can include: floating the dielectric layer over a cavity (no elastomer); eliminating the adhesive under the elastomer; making a cavity in the first layer of PCB; screening elastomeric posts in the cavity instead of a continuous solid; utilizing a thermally stable dielectric or capacitive fluid in a cavity; utilizing a vertical thin film structure in an elastomer cavity; utilizing "snake E" or "chevron" patterns for fan-out lines to further enhance spring action; perforating the dielectric into a grid structure to further enhance spring action; placing deeper ripples local to bumps and eliminating the general ripple pattern; and detaching the bump pad from the surface of the decal.

Figure 13:
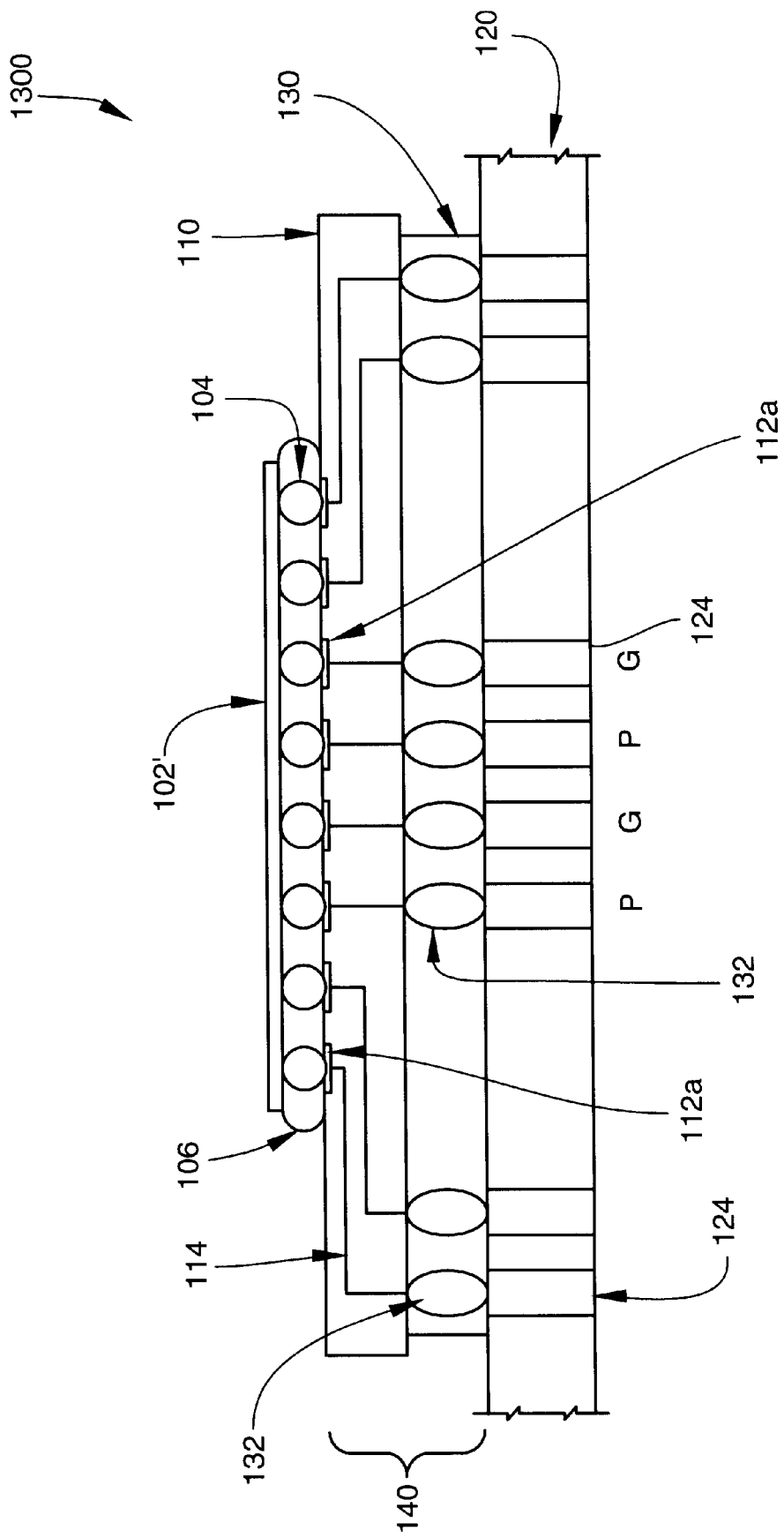
FIG. 13 illustrates yet another embodiment of microelectronic packages according to the present invention.

In another alternative, the integrated circuit itself may be thinned at the back side thereof, to allow greater flexibility and stress relief. FIG. 13 illustrates microelectronic packages 1300 according to the invention with a thinned flip-chip integrated circuit 102'.

Flip-chip mounting allows for backside cooling. As a result, backside cooling traditionally has been used to cool ICs. Conductive plates or pistons have been placed in contact with the backside to create a thermal path to heat sinks. These techniques may be undesirable in low cost applications.

A preferable cooling technique may be to draw the heat out of the face of the IC and to spread the heat into the board. Some heat may be conducted through the solder bumps and into the interconnect traces and/or through an array of ground and power bumps leading down into the board in the interior of the IC as is illustrated in FIGS. 9 and 11. High performance ICs may require supplemental cooling. This may be provided for by several techniques, as follows:

First, loading (fill material) of the dielectric underfill under the chip may be increased. Silica is more conductive than epoxy, so that supplemental cooling may be provided. Alternatively, in case of elastomeric material, the elastomer may be loaded with more thermally conductive material such as aluminum nitride. In another alternative, the ground and power posts may be eliminated. A window of metal-filled material may be screened under the chip. The metal-filled material may be elastomeric organic or stiff. In yet another alternative, a specialized thermal grease (e.g. non-curing—optimized for conductivity) underfill may be utilized between the IC and the PGP to increase thermal conductivity.

Combinations of the above also may be provided. For example, high silica loaded dielectric, elastomeric or stiff underfill may be provided, surrounding electrically and thermally conductive power and ground posts to increase thermal contact area.

A conductor-loaded elastomer (e.g. silicone instead of an epoxy) may be preferable as the material for fabricating both the window and the bumps. The screened bumps may be made from a silver filled silicone and the dielectric that is directly under the IC at least, may comprise a highly loaded silicone such as silica, boron nitride, alumina or other filler.

Many different materials have been indicated for many elements of microelectronic packages according to the invention. For convenience, presently preferred materials and presently known alternatives for various elements of microelectronic substrates according to the present invention are summarized in Table 1 below:

TABLE 1

| Element Name | Reference No. | Presently Preferred Material | Alternative Materials |
|---|---|---|---|
| Thin Film Decal | 110 | BCB | Polyimide |
| Internal Wiring Layer | 114 | Copper | Aluminum |
| Underfill | 106 | Epoxy | Isoimide |
| Dielectric Adhesive Layer | 130 | Fiber Filled Epoxy | Epoxy |
| Conductive Vias | 132 | Ormet | Silver |
| Release Layer | 212 | Polyimide | Inorganic |
| Process Substrate | 210 | Glass | Silicon |
| Elastomeric Stress Buffer | 810 | Silicone | — |
| Elastomeric Dielectric Adhesive Layer | 130' | Silicone | — |
| Elastomeric Stress Buffer | 1012 | Silicone | — |
| Anisotropic Conductive Adhesive | 1014 | Sheidahl | Silver/Epoxy |

Accordingly, a PGP die block may be considered a photolithographically fabricated passive IC containing primarily thin film interconnect. Other electronic structures which support a system may be contained in the decal, such as embedded passives including capacitors, resistors, etc. The PGP is processed on a process substrate well suited for fine line lithography, such as polished silicon wafer, glass, quartz, etc. A process substrate includes at least one die block. A plurality of die blocks may be obtained by dicing the process substrate. The thin film layers on this block are then transferred to the surface of a low density interconnect substrate such as a PCB and electrically connected to the thick film substrate by means of conductive and dielectric adhesives, such as silver filled epoxy and silica filled epoxy, interposed between the thin film and the low density substrate. Thus, layers of high density interconnect may be fabricated "en masse" on a lithographically ideal substrate and then transferred to a PCB, rather than trying to build up high density interconnects on a PCB.

The PGP decal contains at least one level of metal. A transferred layer with a single level of metal may serve as a geometry transformer to spread the tight pitch of a packaged or bare IC die out to a larger grid on the surface of a low density second level substrate. This may be referred to as a fan-out structure. Two or more levels of metal in a PGP may allow for more complex interconnect structures.

In addition to serving as a geometry transformer, I/O may be routed such that the random patterns of the chip I/O with respect to the system requirements may be optimized to the net list of the system. Pad translation can take place in the thin film decal by routing over different wiring levels in a multi-level metal interconnect. Thin film layers also may be added for ground and/or power supply planes. Two or more electronic components may be interconnected in the decal at the surface without routing into the thick film layers. This can produce an MCM at the surface of the thick film.

The PGP can provide parallel design and processing of high-density interconnect. Yield can be decoupled from that of the low density substrate. Improved turn-around time of complex interconnects compared to direct processing on a PCB may be provided. The PGP may be tested before being committed to a PCB. Rework also is possible prior to final cure after the PGP is applied to the PCB.

The PGP also can enable area array solder bumping of components on a low density PCB by transformation of geometry and by providing solder bump compatible surface metallurgy and/or solder itself. The PGP can serve as stress relieving structure between a substrate and an electronic component if elastomeric materials are utilized. For example, a layer of elastomeric material may be interposed between the PCB and the decal to provide stress relief. This can further enable an area array flip-chip.

As opposed to flex structures on a board, the PGP need not be in a freestanding or suspended state. Thus, the photolithographic grid can be maintained by direct transfer from one stiff substrate to another.

Finally, the stiff, dimensionally stable process substrate can be well suited to automated pick-and-place techniques on existing equipment for alignment and placement of the PGP on a PCB.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of fabricating a microelectronic package, comprising the steps of:

forming a release layer on a substrate;

forming a thin film decal on the release layer, the thin film decal including first and second opposing decal faces, a plurality of first decal input/output pads on the first decal face, a plurality of second decal input/output pads on the second decal face and at least one internal wiring layer that is electrically connected to at least one of the first and second decal input/output pads, the first decal input/output pads being adjacent the release layer and the second decal input/output pads being remote from the release layer;

forming on the second decal face, a dielectric adhesive layer that includes first and second opposing dielectric adhesive layer faces and a plurality of conductive vias therein that extend between the first and second opposing dielectric adhesive layer faces, the first dielectric adhesive layer face being adjacent the second decal face and the second adhesive dielectric layer face being remote from the second decal face, such that at least one of the conductive vias electrically connects to at least one of the second decal input/output pads;

adhesively bonding the dielectric adhesive layer second face to a second level substrate including a plurality of second level substrate input/output pads on a face thereof, such that at least one of the conductive vias electrically connects to at least one of the second level substrate input/output pads; and processing the release layer to thereby release the substrate from on the first face of the thin film decal.

2. A method according to claim 1 wherein the processing step is followed by the step of:

bonding a first level substrate including a plurality of microelectronic devices and a plurality of first level substrate input/output pads on a face thereof to the first decal face layer such that at least one of the conductive vias electrically connects to at least one of the first level substrate input/output pads.

3. A method according to claim 1 wherein the step of forming on the second decal face, a dielectric adhesive layer, comprises the steps of:

adhesively bonding to the second decal face, a dielectric adhesive layer including therein a plurality of holes, at least one of which laterally overlaps at least one of the second decal input/output pads; and screening a conductive adhesive into the at least one of the holes in the dielectric adhesive layer.

4. A method according to claim 1 wherein the following step is performed between the steps of forming a dielectric adhesive layer and adhesively bonding:

singulating the substrate, the thin film decal and the dielectric adhesive layer.

5. A method according to claim 1 wherein the step of processing the release layer comprises the step of dissolving the release layer.

6. A method according to claim 2 wherein the first level substrate is an integrated circuit and wherein the second level substrate is a printed circuit board.

7. A method according to claim 2 wherein the step of bonding a first level substrate comprises the step of reflowing solder bumps between the first level substrate input/output pads and the first decal face.

8. A method according to claim 1 wherein lithography is used to create the thin film decal with a rippled first surface and rippled internal wiring layer.

9. A method according to claim 1 wherein the processing of the release layer to release the substrate from the first face of the thin film decal comprises the use of a laser to destroy bonds between the thin film decal and the substrate.

10. A method according to claim 1 wherein the processing of the release layer to release the substrate from the first face of the thin film decal comprises use of an appropriate etchant in a batch process to release the substrate from the first face of the thin film decal.

* * * * *